United States Patent [19]
Holmberg et al.

[11] Patent Number: 5,123,847
[45] Date of Patent: * Jun. 23, 1992

[54] METHOD OF MANUFACTURING FLAT PANEL BACKPLANES, DISPLAY TRANSISTORS

[76] Inventors: Scott H. Holmberg, 4598 Ravinewood, Milford, Mich. 48042; Richard A. Flasck, 1346 W. Fairview, Rochester, Mich. 48063

[*] Notice: The portion of the term of this patent subsequent to Oct. 8, 2002 has been disclaimed.

[21] Appl. No.: 464,933

[22] Filed: Jan. 16, 1990

Related U.S. Application Data

[60] Continuation of Ser. No. 150,927, Feb. 1, 1988, abandoned, which is a division of Ser. No. 493,523, May 11, 1983, Pat. No. 4,736,229.

[51] Int. Cl.$^5$ ............................................. H01L 21/265
[52] U.S. Cl. ..................... 437/48; 148/DIG. 105; 437/50; 437/151; 437/181; 437/192; 437/962
[58] Field of Search ............... 148/DIG. 53, 105, 120, 148/172; 357/4, 23.7; 437/2, 3, 4, 50, 41, 51, 59, 54, 60, 48, 62, 101, 84, 181, 192, 245, 234, 914, 916, 919, 962; 156/643, 652, 653, 656, 657, 663

[56] References Cited

U.S. PATENT DOCUMENTS

| | | | |
|---|---|---|---|
| 4,545,112 | 10/1985 | Holmberg et al. | 437/189 |
| 4,563,806 | 1/1986 | Coissard et al. | 437/54 |
| 4,601,097 | 7/1986 | Shimbo | 437/59 |
| 4,624,737 | 11/1986 | Shimbo | 437/181 |
| 4,680,085 | 7/1987 | Vijan et al. | 437/3 |
| 4,697,331 | 10/1987 | Boulitrop et al. | 437/101 |
| 4,732,873 | 3/1988 | Perbet et al. | 437/101 |
| 4,735,822 | 4/1988 | Ohtoshi et al. | 437/4 |
| 4,736,229 | 4/1988 | Holmberg et al. | 357/4 |
| 4,736,234 | 4/1988 | Boulitrop et al. | 437/3 |

Primary Examiner—Olik Chaudhuri
Assistant Examiner—William Bunch

[57] ABSTRACT

An improved method of manufacturing active matrix display backplanes with thin film transistors thereon and a drive scheme therefor. A refractory metal covers the indium tin oxide (ITO) layer, patterned to form a gate electrode for the transistors and to protect the pixel pad ITO during formation of the transistors. To reduce shorts and capacitance between the gate and the source or the drain, an intermetal dielectric is patterned to form a central portion over a planar portion of the gate region and to cover any exposed gate edges.

26 Claims, 5 Drawing Sheets

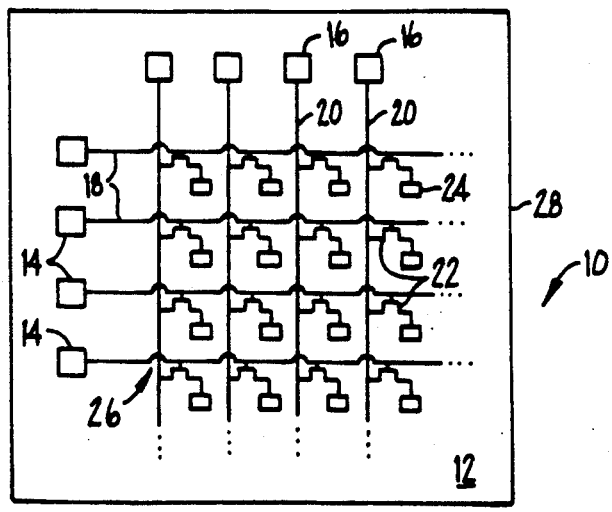
FIG._1. PRIOR ART
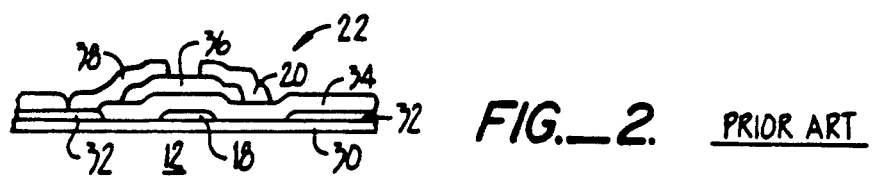
FIG._2. PRIOR ART
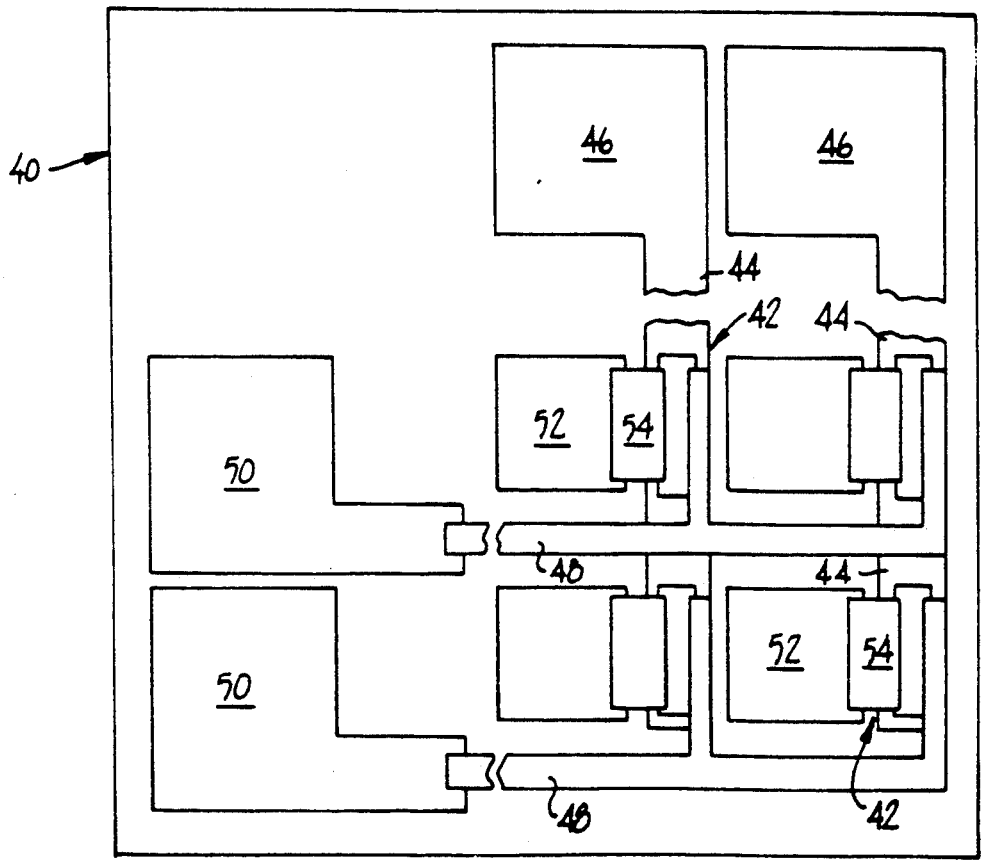
FIG._3.

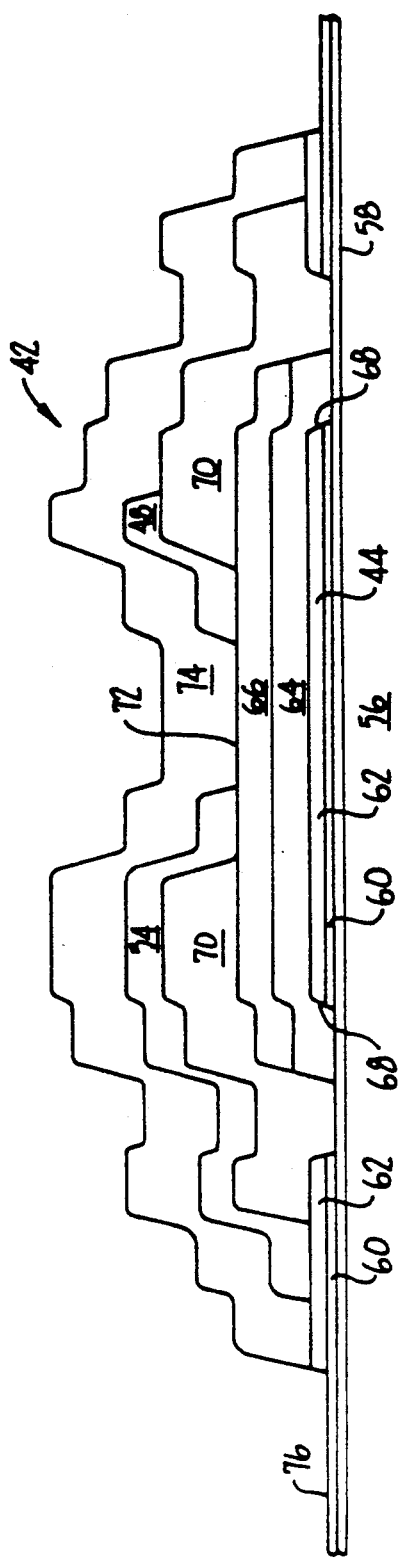
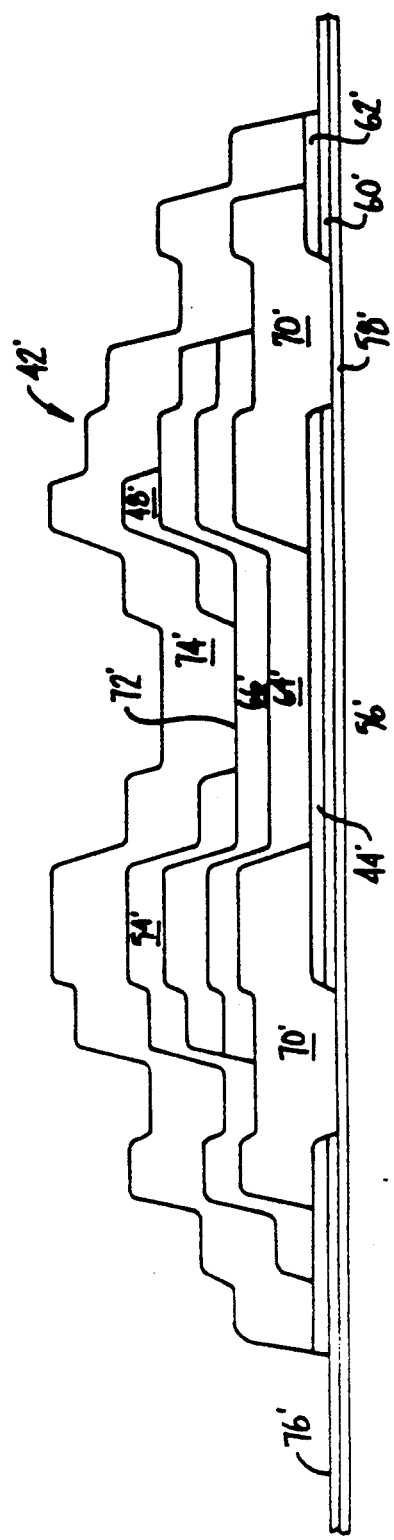

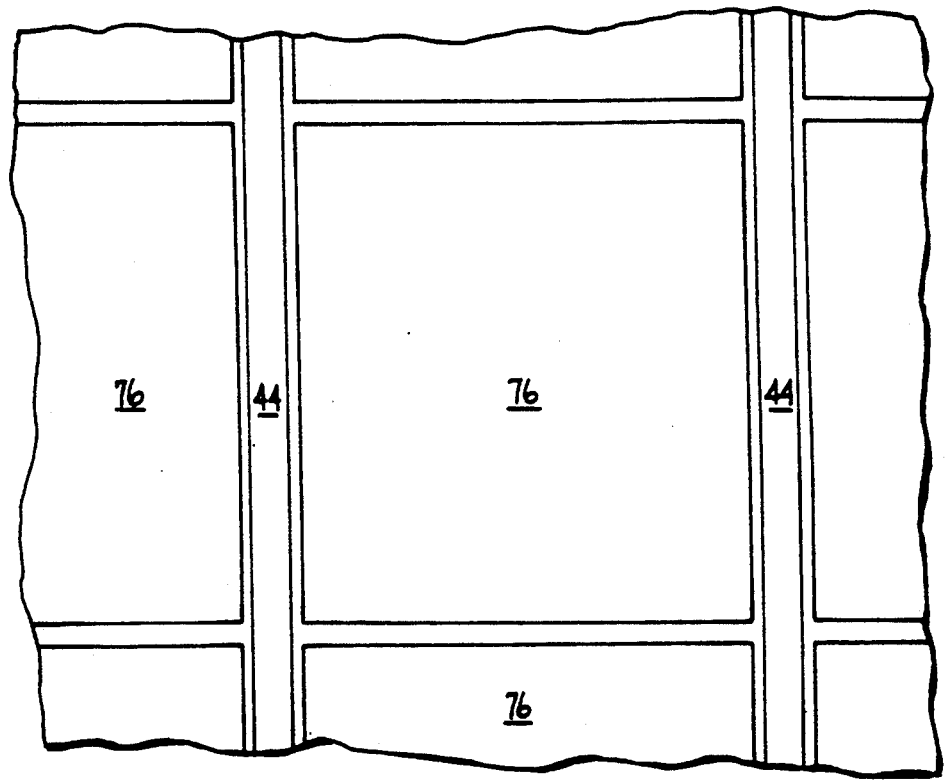
FIG._6.
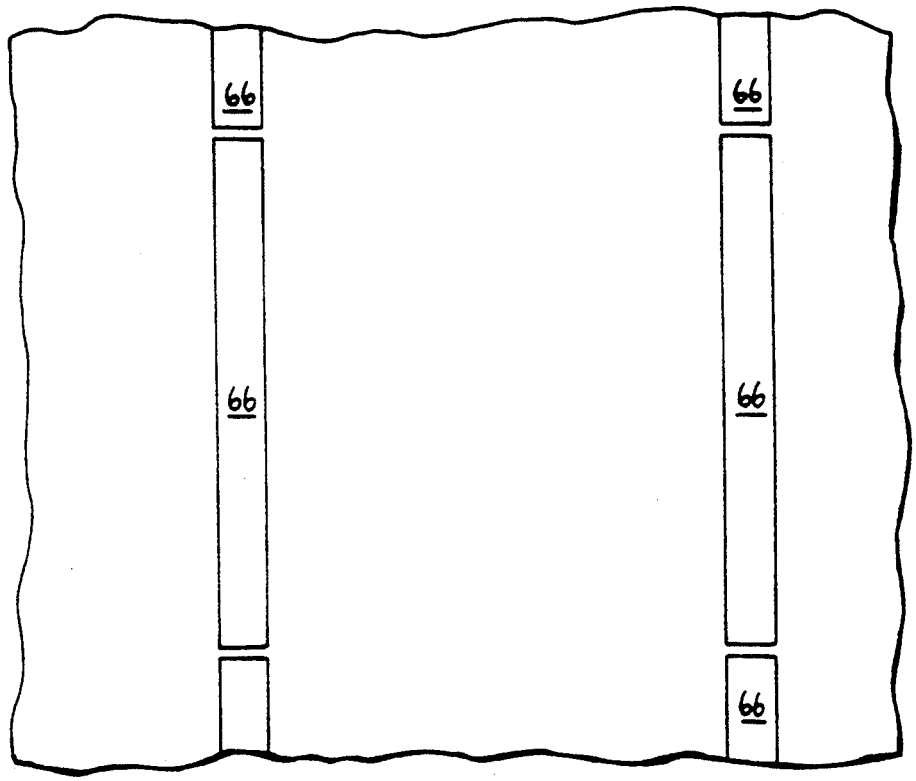
FIG._7.

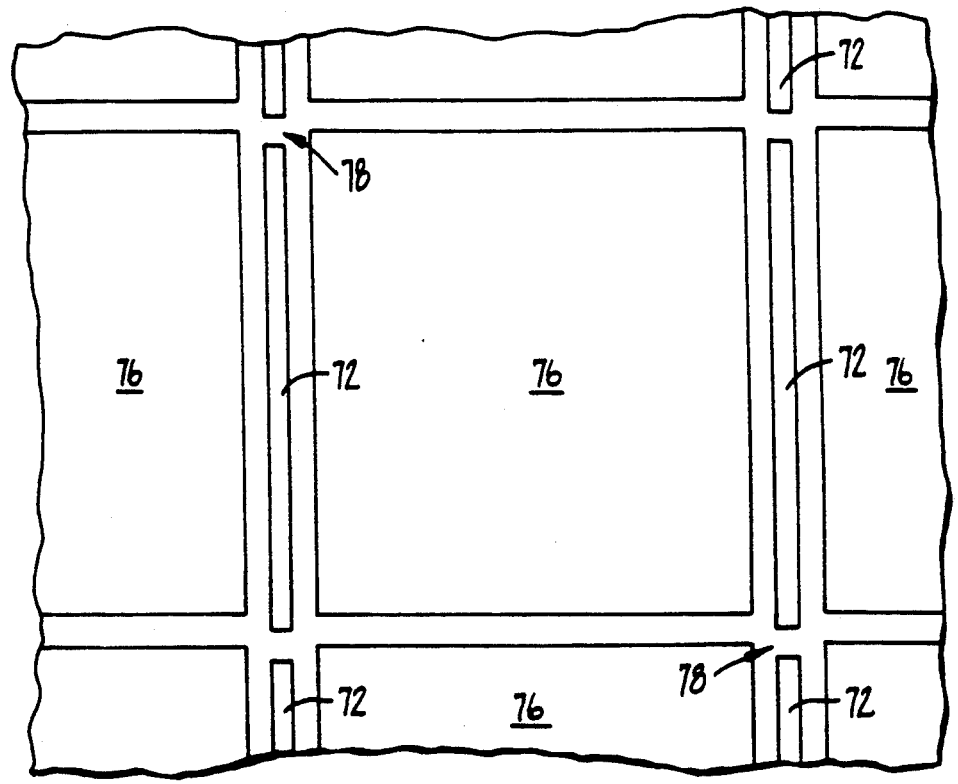
FIG._8.
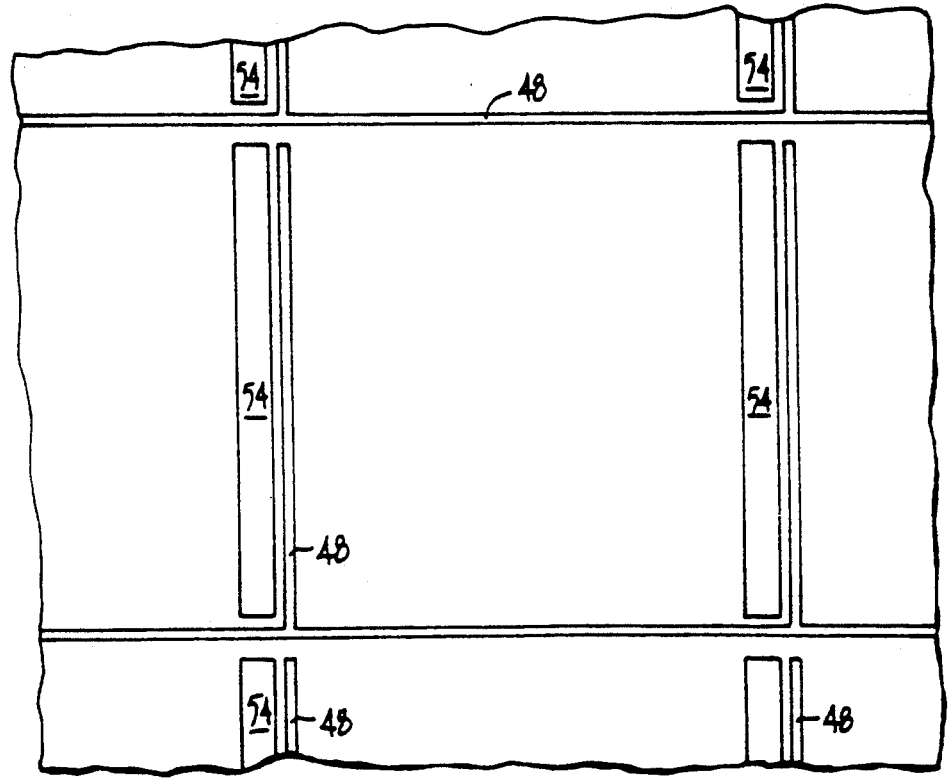
FIG._9.

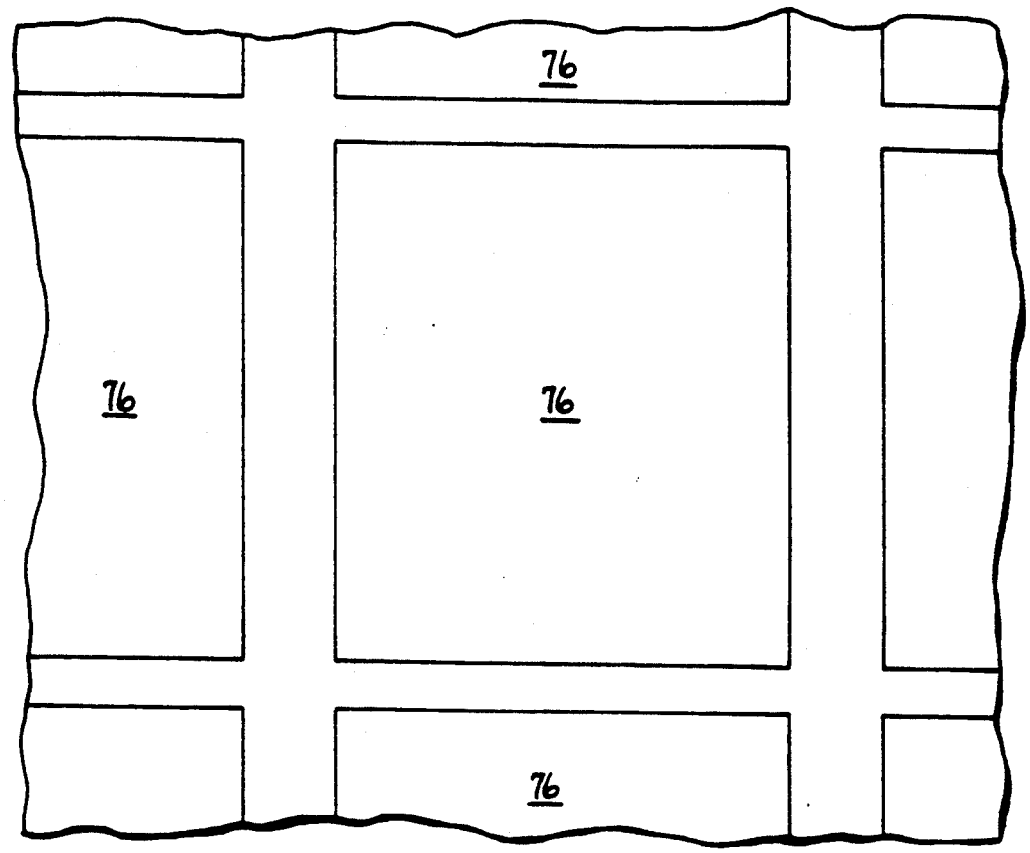
FIG.__10.
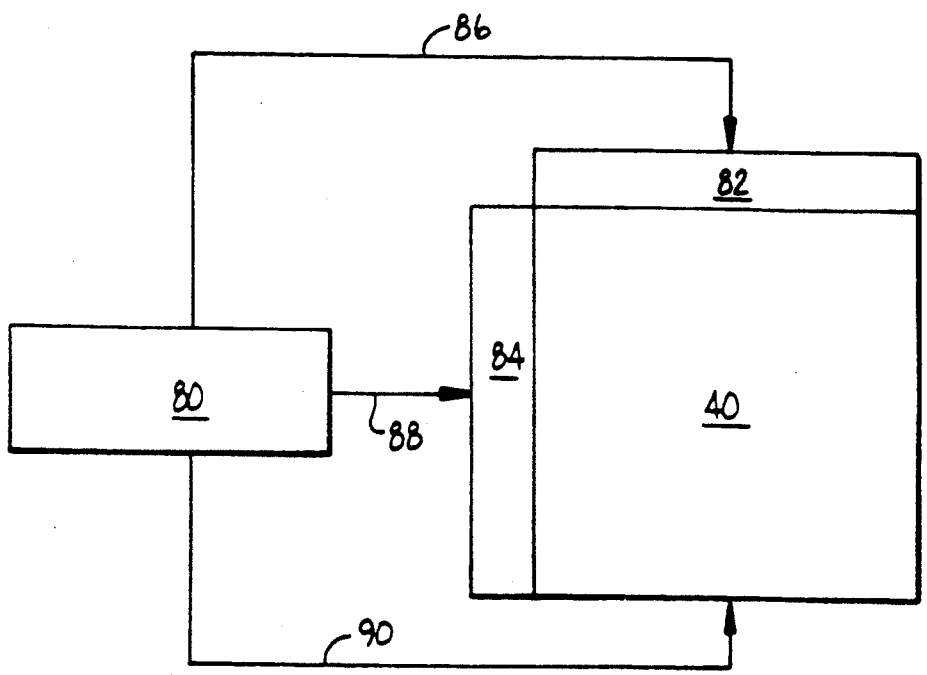
FIG.__11.

METHOD OF MANUFACTURING FLAT PANEL BACKPLANES, DISPLAY TRANSISTORS

This is a continuation of application Ser. No. 07/150,927 filed on Feb. 1, 1988, now abandoned, which is a divisional of Ser. No. 06/493,523 filed on May 11, 1983 now U.S. Pat. No. 4,736,299.

BACKGROUND OF THE INVENTION

The present invention pertains to an improved flat panel display and method of making same. More particularly, the present invention is directed to a method of making improved flat panel display backplanes and the switching transistors thereon.

In recent years there has been growing interest in flat panel displays, such as those which employ liquid crystals, electrochomic or electroluminescence, as replacements for conventional cathode ray tubes (CRT). The flat panel displays promise lighter weight, less bulk and substantially lower power consumption than CRT's. Also, as a consequence of their mode of operation, CRT's nearly always suffer from some distortion. The CRT functions by projecting an electron beam onto a phosphor-coated screen. The beam will cause the spot on which it is focused to glow with an intensity proportional to the intensity of the beam. The display is created by the constantly moving beam causing different spots on the screen to glow with different intensities. Because the electron beam travels a further distance from its stationary source to the edge of the screen than it does to the middle, the beam strikes various points on the screen at different angles with resulting variation in spot size and shape (i.e. distortion).

Flat panel displays are inherently free of such distortion, because each pixel element receives the same power. In the manufacture of flat panel displays the circuit elements are deposited and patterned, generally by photolithography, on a substrate, such as glass. The elements are deposited and etched in stages to build a device having a matrix of perpendicular rows and columns of circuit control lines with a pixel contact and control element between the control line rows and columns. The pixel contact has a medium thereon which is a substance that either glows (active) or changes its response to ambient light (passive) when a threshold voltage is applied across the medium control element. The medium can be a liquid crystal, electroluminescent or electrochromic materials such as zinc sulfide, a gas plasma of, for example, neon and argon, a dichroic dye, or such other appropriate material or device as will luminesce or otherwise change optical properties in response to the application of voltage thereto. Light is generated or other optical changes occur in the medium in response to the proper voltage applied thereto. Each optically active medium is generally referred to as a picture element or "pixel".

The circuitry for a flat panel display is generally designed such that the flat panel timeshares, or multiplexes, digital circuits to feed signals to one row and column control line of the pixels at a time. Generally one driving circuit is used for each row or column control line. In this way a subthreshold voltage can be fed to an entire row containing hundreds or thousands of pixels, keeping them all dark or inactive. Then a small additional voltage can be supplied selectively to particular columns to cause selected pixels to light up or change optical properties. The pixels can be made to glow brighter by applying a larger voltage or current or a longer pulse of voltage or current. Utilizing liquid crystal displays (LCD's) with twisted nematic active material, the display is substantially transparent when not activated and becomes light absorbing when activated. Thus, the image is created on the display by sequentially activating the pixels, row by row, across the display. The geometric distortion described above with respect to CRT's is not a factor in flat panel displays since each pixel sees essentially the same voltage or current.

One of the major problems that arises with respect to the prior art method of manufacture of backplanes for active matrix displays (e.g. those employing thin film transistors at each pixel) is that they generally suffer production yield problems similar to those of integrated circuits. That is, the yields of backplanes produced are generally not 100% and the yield (percentage of backplanes with no defects) can be 0% in a worst case. High quality displays will not tolerate any defective transistors or other components. Also, larger size displays are generally more desirable than smaller size displays. Thus, a manufacturer is faced with the dilemma of preferring to manufacture larger displays, but having to discard the entire product if even one pixel is defective. In other words, the manufacturer suffers a radically increased manufacturing cost per unit resulting from decreasing usuable product yield.

These problems of increased cost and decreased yield are dramatically improved in the present invention by providing a method of manufacture of active display backplanes, including the display transistors with a greatly reduced number of defects.

SUMMARY OF THE INVENTION

There is provided an improved method of manufacturing backplanes for active matrix displays including improved transistors to greatly reduce display defects and provide improved backplane subassemblies for the displays. A drive scheme for driving the displays is also disclosed.

These improvements are accomplished by depositing a refractory metal over the indium tin oxide (ITO) layer which serve both as a gate for the transistors and as a protective coating for the pixel ITO during the backplane processing to form the transistors. The transistor is completely formed before the refractory metal is etched off of the pixel ITO to form the pixel contact. To also reduce shorts between the gate and the source or the drain, an intermetal dielectric is deposited over the gate or the gate and gate insulator. The intermetal dielectric is then etched away only in the central planar portion of the gate region to eliminate any edge shorting. The edge shorting is eliminated since the following layers are deposited only on the planar portion with the edges isolated therefrom.

BRIEF DESCRIPTION OF THE DRAWINGS

FIG. 1 is a plan view schematic representation of an active matrix display backplane made by a prior art method;

FIG. 2 is a cross-section of one transistor of the prior art backplane;

FIG. 3 is a plan view schematic representation of one embodiment of a matrix display of the present invention;

FIG. 4 is a first embodiment of a backplane transistor of the present invention taken along the line 4—4 of FIG. 3;

FIG. 5 is a second embodiment of the backplane transistor of the present invention;

FIGS. 6-10 are partial plan views of the display backplane manufacturing steps; and FIG. 11 is a schematic diagram of one embodiment of a matrix display drive circuit.

DESCRIPTION OF THE PREFERRED EMBODIMENTS

Referring now more particularly to FIG. 1, there is shown a schematic representation of an active matrix flat panel display device 10 made in accordance with conventional photolithographic techniques. One such device 10 and the manufacture thereof is more fully described in Application of Amorphous Silicon Field Effect Transistors in Addressable Liquid Crystal Display Panels, A. J. Snell et al., *Applied Physics*, No. 24, p. 357, 1981. The device 10 includes a substrate 12, sets of contact pads 14 and 16, sets of control lines 18 and 20, and, in this particular example of the prior art, transistors 22 and pixel back contacts 24.

The substrate 12 commonly employed in these devices is formed from glass. The control lines 18 and 20 are organized into a matrix of rows 18 and columns 20. The control line rows 18 in this device 10 serve as gate electrodes and the control line columns 20 as source connections. One contact pad 14 is connected to each end of the row control lines 18. One contact pad 16 is connected to each end of the column control lines 20. The display drive control (not shown) is connected to the sets of pads 14 and 16.

At each matrix crossover point 26, where a row line 18 and a column line 20 cross, one switching element, transistor 22 is formed to connect the row line 18 and column line 20 to the pixel back contacts 24. The active medium is deposited at least on the contacts 24 which will optically change properties in response to the combined voltages or currents in the respective crossover point 26 formed by the row 18 and column 20. The active medium at a given cross-over point 26 will appear as a square or dot in the overall checkerboard type matrix of the display 10. The actual size of the transistors 22 and the contacts 24 are not now drawn to scale, but are shown schematically for illustration only.

It should be noted that theoretically there is no limit on the number of rows 18 and columns 20 that can be employed, only a portion of which are illustrated in FIG. 1. Therefore, there is also no theoretical limit on the outside dimensions of such a device 10. However, the present state of the lithographic art places a practical limit on the outside dimensions of these devices. The present alignment techniques allow display devices to be manufactured approximately five inches on a side 28.

The problem encountered by the prior art method of manufacture is that if the array of device 10 contains any defective pixel transistors 18 or other circuit elements causing a pixel to be inoperative, it must be discarded.

Referring in detail to FIG. 2, several problems occur when the switching element, transistor 22 is manufactured. The substrate 12 is a substantial portion of the backplane cost and hence an inexpensive soda-lime glass is generally utilized. It has been demonstrated by liquid crystal display manufactures that the high sodium concentration can poison the liquid crystal material by diffusing through the overlying ITO layer and hence an $SiO_2$ suppression layer 30 is generally formed on the substrate 12. There are some high quality low sodium types of substrates available, which would not need the suppression layer 30. An ITO layer 32 is formed and etched to provide an ITO free area on which the gate 18 is deposited. Following the deposition of the gate 18, a gate insulator layer 34 is deposited. Although a smooth uniform coverage of the gate 18 by the insulator 34 is illustrated, in production the gate 18 has or can have sharp edges which lead to pin holes or thinning of the insulator 34 at the gate edges. The source and drain metals can short to the gate 18. The thinning or pin holes produce transistors 22, which if operative, do not have uniform operating characteristics and hence the backplane is worthless.

One attempt to solve this problem, is to make the gate 18 very thin, but the resistivity is then too high to make the large arrays necessary for the backplane. A second attempt to solve the problem, is to make the gate insulator 34 very thick, but this decreases the gain of the transistor 22 and is also self defeating.

An amorphous silicon layer 36 is then deposited, with the source 20 and a drain 38 deposited thereover. A passivating layer (not shown) would be deposited over the completed structure to complete the transistor 22. During operation the activation of the source 20 and the gate 18 couples power through the silicon alloy 36 to the drain and hence to the contact pad 24 formed by the ITO layer 32.

In processing the backplane to form the transistor 22, the ITO layer 32 is subjected to numerous processing steps, both depositing material and etching the material away. This can lead to nonuniformity of the ITO layer 32 which can also cause the backplane to be defective. These problems are overcome by the method and resulting backplane and transistor structure employed in the present invention, which will now be discussed with reference to FIGS. 3-10.

A matrix display 40 of the present invention is illustrated schematically in FIG. 3. A plurality of transistors 42 are each coupled in columns by one of a plurality of gate lines 44 to one of a plurality of gate contact pads 46. The transistors 42 are each coupled by one of a plurality of source lines 48 to one of a plurality of source gate pads 50. Each transistor 42 is also coupled to a respective one of a plurality of pixels 52 by a respective drain electrode 54.

Referring now more particularly to FIG. 4, there is shown a schematic representation of one preferred embodiment of the transistor 42 made in accordance with the present invention. A glass substrate 56 includes a barrier $SiO^2$ layer 58 thereon. The detailed deposition steps will be described with respect to FIGS. 6-10. An ITO layer 60 is deposited and then a refractory metal layer 62 is deposited on the ITO layer 60.

The layers 60 and 62 are etched to form the gate electrode 44. A gate insulator 64 and a semiconductor material 66 are sequentially deposited over the gate 44. The material 66 preferably is an amorphous silicon alloy. To avoid the possibility of any gate to source or drain shorts at gate edges 68, an intermetal dielectric 70 is deposited over the gate 44, the gate insulator 64 and the semiconductor 66. The dielectric 70 is deposited to a sufficient thickness to ensure that no shorts or thin spots are formed between the edges 68 of the gate 44 and the source 48 and the drain 54.

The dielectric 70 is etched away only on a substantially planar central region 72 of the semiconductor layer 66. This insures uniform operating characteristics for the transistors 42 in the backplane array. A passivating layer 74 is deposited over the whole structure to complete the structure of the transistor 42.

During all of the transistor processing steps, the refractory metal layer 62 remains over a pixel contact pad 76 upon which the active material of the pixel 52 is deposited. As a final step, before the active medium (not shown) is added to the backplane to complete the display the refractory metal is etched off of the pixel pad 76 leaving the ITO layer 60 exposed after all the processing has been completed.

An alternate embodiment of the transistor 42' is illustrated in FIG. 5. The major difference is that the intermetal dielectric 70' is deposited before the gate insulator 64', but the dielectric 70' performs the same function as in the FIG. 4 embodiment, as does the refractory metal layer 62'.

The detailed deposition procedure will now be described, referring to FIGS. 3, 4 and 6-10. Although generally LCD users purchase the substrate 56 with the $SiO_2$ barrier layer 58 and ITO layer 60 thereon, it is preferred that the glass substrate 56 be purchased without any of the layers deposited thereon. This avoids any nonuniformity or other defects and also allows the layers 58, 60 and 62 to be deposited in one deposition run utilizing semiconductor standards.

Defects in the ITO layer 60 under the gate 44 can cause shorts. The substrate 56 is first cleaned, such as by a dionized water rinse and dried. The surface of the substrate 56 is then sputter etched which is followed by depositing the $SiO_2$ layer 58, to a thickness in the range of about 250-2000 Å, and preferably about 500 Å, the ITO layer 60 to a thickness in the range of about 100-500 Å and preferably about 300 Å and then the refractory metal layer 62 to a thickness in the range of 500-2000 Å and preferably about 1000 Å.

The refractory metal 62 is preferably $Ni_xCr_{1-x}$, $0 \leq x \leq 0.8$, and preferably $Ni_{60}Cr_{40}$. Other refractory metals and alloys such as Ti, TiW, Mo or Ta can also be utilized to meet the following functions. The refractory metal 62 shields the ITO layer 60 from the processing gases and etchants to insure that the thickness, integrity, resistivity and optical characteristics of the ITO layer 60 are retained. Therefore the refractory metal must withstand the gas plasmas containing silane ($SiH_4$), which can be at processing temperatures of greater than 200° C. which an unprotected ITO layer 60 will react with. For example, $SiH_4$ is generally utilized as one of the gases to produce silicon nitride ($Si_3N_4$) and hence would attack the ITO layer 32 in forming the prior art transistor 22 (FIG. 2). The other steps as described below include metal deposition, plasma etching, chemical etching and photoresist stripping.

The refractory metal 62 must have good adhesion to the ITO layer 60 as well as the gate insulator 64, the intermetal dielectric 70 and the drain 54. When light is passed through the substrate 56, then the gate 44 provides a required gate light blocking function since the transistor 42 is light sensitive. If light is directed through the other side of the backplane then the passivating layer 74 will include a light blocking material or another light blocking layer will be added.

The refractory metal 62 must be etchable from the ITO layer 60 without effecting it when the structure of the transistor 42 is complete. Further, the refractory metal must serve as a stable gate 44 and should have a low sheet resistivity. For example, $Ni_{60}Cr_{40}$ about 1000 Å thick has a sheet resisitivity of about 10 ohms/square which is necessary for the long gate lines in the backplane.

A photoresist is applied to the refractory metal layer 62 which is then soft baked. The photoresist is aligned and exposed through a mask and then is developed and hard baked. The metal layer 62 and the ITO layer 60 are then successively etched, rinsed and dried. Then the photoresist is stripped from the substrate, which is then rinsed and dried leaving the pattern shown in FIG. 6. This leaves a pattern of gates 44, pixel pads 76 (FIG. 4) and contact pads 46 and 50 (FIG. 3).

The gate insulator 64 and the semiconductor layer 66 are now sequentially deposited, preferably in a plasma at a substrate temperature of about 275° C. The insulator layer 64 preferably is $Si_3N_4$ deposited in the range of about 500 to 5000 Å thick and preferably about 2500 Å thick. The semiconductor layer 66 preferably is an amorphous silicon alloy and is preferably deposited from $SiH_4$ to a thickness of about 300 to 5000 Å and preferably about 2500 Å. A photoresist is spun on, soft baked, aligned, exposed, developed and etched. The layers 64 and 66 are preferably plasma etched in a carbon tetrafluoride ($CF_4$) plasma. The photoresist is then stripped, rinsed and dried. This results in the active semiconductor areas 66 separated along the lengths of the gates 44 as shown in FIG. 7.

The intermetal dielectric 70 is then deposited, preferably in a plasma with a substrate temperature of 250° C. The dielectric preferably is $SiO_2$ with a thickness in the range of 2000-10,000 Å and preferably about 5000 Å. The photoresist is then applied, soft baked, aligned and exposed. The resist is then developed out from the areas over the central portion 72 of the semiconductor layer 66, the pixel pads 76 and the gate and source contact pads 46 and 50. After hard baking the exposed $SiO_2$ layer is etched, and then the resist is stripped, rinsed and dried to leave the central portions 72 and the pixel pads 76 exposed as shown in FIG. 8. The gate and source contact pads 46 and 50 (FIG. 3) are also exposed. A plurality of regions 78 between the exposed portions 72 of the semiconductor layer 66 are left covered by the intermetal dielectric layer 70 which adds additional isolation to the transistors 42 when the source electrodes 48 are deposited over these areas (FIGS. 3 and 9).

An aluminum alloy is then sputter deposited or evaporated to a thickness in the range of about 500 to 5000 Å and preferably about 2500 Å. A photoresist is then applied, soft baked, aligned, exposed, developed and hard baked. The exposed alloy is then etched. The photoresist is then stripped, rinsed and dried to leave the source and drain lines 48 and 54 as shown in FIGS. 3 and 9.

The passivation layer 74 is then deposited, preferably $SiO_2$ or $Si_3N_4$ from a plasma with a substrate temperature of about 250° C. to a thickness in the range of 2000 to 10,000 Å and preferably about 5000 Å. A photoresist is then applied, soft baked, aligned and exposed. The resist is then developed from the gate and source contact pads 46 and 50 and the pixel contact pads 76. After hard baking the passivation layer is then removed from these areas by plasma or buffered oxide etch, rinsed and dried leaving the pattern shown in FIG. 10.

The pixel contact pads 76 and the gate and source pads 46 and 50 are then etched to remove the refractory metal from the ITO layer 60, rinsed and dried. The resist is then stripped, rinsed and dried. The back planes are then ready to be processed to add the active medium.

In view of the above discussion, it can readily be seen that the present invention provides a method of manufacturing backplanes for active matrix display devices that radically decreases production costs by substantially increasing the yield of profitable products.

Referring to FIG. 11, a drive scheme is illustrated for the completed matrix display 40. The backplanes have the active medium, such as twisted nematic active material, applied between the backplane and a frontplane (not illustrated) which can be another glass substrate. The display 40 then is connected to a controller 80 by a gate line driver 82 and a source line driver 84. The drivers 82 and 84 are connected to each respective gate or source line.

The controller 80 provides a gate drive signal over a gate drive line or lines 86 and a source drive signal over a source drive line or lines 88. The desired pixels can then be activated by the controller 80 which also provides a frontplane drive signal on a frontplane line 90.

A first drive scheme embodiment is illustrated in Table 1.

TABLE 1

| Frontplane | $V_G$ Write 0 or 1 | $V_S$ Write 0 | $V_S$ Write 1 | $V_S$ Non-selected |
|---|---|---|---|---|
| +10V | +15V | +10 | 0 | −10V |
| 0 | +15V | 0 | +10 | −10V |

The nonselected gate lines are held at the most negative voltage to insure that the transistor will not turn on when the frontplane is alternated. The frontplane and source line voltages are alternated so a constant direct current is not applied to the pixels, since a long term direct current causes the pixel active material to fail very rapidly. The voltages can be alternated at any frequency, but preferably in the range of 30 to 100 hertz.

A second drive scheme embodiment is illustrated in Table 2.

TABLE 2

| Frontplane | $V_G$ Write 0 or 1 | $V_S$ Write 0 | $V_S$ Write 1 | $V_S$ Non-selected |
|---|---|---|---|---|
| 0 | +15V | 0 | +10V | −10V |
| 0 | +15V | 0 | −10V | −10V |

In this embodiment, the source line for the activated pixels is alternated and the rest of the voltages are held constant.

Modifications and variations of the present invention are possible in light of the above teachings. As mentioned above, the devices can be of any desired shape and size. Also, any type of thin film semiconductor material can be utilized, not just those formed from silane. The amorphous silicon alloys can be deposited from any suitable reaction gas mixture containing at least silicon and hydrogen. Further, other semiconductor materials can be utilized such as cadmium selenide, (CdSe), which can be deposited by sputtering or evaporation processes. Although the substrate 56 is described as having a barrier layer 58 thereon, a high quality substrate containing a small amount of or no sodium can be utilized, in which case the barrier layer 58 can be eliminated. It is therefore to be understood that within the scope of the appended claims the invention may be practiced otherwise than as specifically described.

What is claimed and desired to be secured by Letters Patent of the United States is:

1. A method of manufacturing matrix display backplanes comprising:
   providing a glass substrate with an insulator layer and a conductive oxide layer on said insulator layer;
   depositing a refractory metal layer on said conductive oxide layer prior to subsequent processing steps; and
   processing the substrate and layers to form matrix transistors with said refractory metal layer protecting said conductive oxide layer.

2. The method as claimed in claim 1, further including:
   removing portions of said refractory metal and said conductive oxide layers to form at least one gate electrode.

3. The method as claimed in claim 2, further including:
   depositing a gate insulator layer and a semiconductor layer successively onto said gate electrode.

4. The method as claimed in claim 3 wherein:
   depositing said semiconductor layer includes plasma depositing an amorphous silicon alloy.

5. The method as claimed in claim 3 further including:
   depositing an intermediate dielectric layer over said gate electrode, said gate insulator and said semiconductor layers; and
   removing a central portion of said dielectric layer from said semiconductor layer.

6. The method as claimed in claim 5 further including:
   depositing the source and drain electrodes over said semiconductor layer; and
   forming a passivating layer over said matrix transistors.

7. The method as claimed in claim 6 further including:
   removing the refractory metal layer from said oxide layer adjacent said matrix transistors to form pixel contact pads.

8. The method as claimed in claim 1 including:
   depositing said insulator layer on said substrate; and
   depositing said conductive oxide layer on said insulating layer.

9. The method as claimed in claim 2 further including:
   removing portions of said refractory metal and said conductive oxide layer to form a plurality of gate electrodes, gate contact pads, pixel pads and source contact pads with each of said gate electrodes coupled to one of said gate contact pads.

10. The method as claimed in claim 2 further including:

depositing an intermetal dielectric layer over said gate electrode; and removing a central portion of said dielectric layer from said gate electrode.

11. The method as claimed in claim 10 further including:

depositing a gate insulator and a semiconductor layer successively onto said gate electrode.

12. The method as claimed in claim 11 wherein:

depositing said semiconductor layer includes plasma depositing an amorphous silicon alloy.

13. The method as claimed in claim 11 further including:

depositing the source and drain electrodes over said semiconductor layer; and forming a passivating layer over said matrix transistors.

14. The method as claimed in claim 13 further including:

removing the refractory metal layer from said conductive oxide layer adjacent said matrix transistors to form pixel contact pads.

15. A method of manufacturing matrix display backplanes comprising:

providing a substrate;

depositing a gate electrode on said substrate having at least one exposed edge;

depositing a gate insulator on said gate electrode;

depositing a semiconductor material on said insulator;

depositing an intermetal dielectric adjacent said edge of said gate electrode; and depositing a drain electrode onto at least a portion of said intermetal dielectric adjacent said edge of said gate electrode to form matrix transistor elements.

16. The method as claimed in claim 15 including:

depositing said gate insulator to substantially cover said gate electrode and depositing said semiconductor material to substantially cover said gate insulator;

depositing said intermetal dielectric over said gate electrode, said insulator and said semiconductor material;

removing a central portion of said intermetal dielectric to expose a substantially planar portion of said semiconductor material prior to depositing said drain electrode; and depositing a source electrode concurrently with said drain in electrode.

17. The method as claimed in claim 16 wherein:

providing said substrate includes providing a glass substrate; and depositing a conductive oxide layer on said insulator layer.

18. The method as claimed in claim 17 wherein:

depositing said gate electrode includes depositing a refractory metal layer on said conductive oxide layer; and removing portions of said refractory metal and said conductive oxide layer to form said gate electrode.

19. The method as claimed in claim 18 further including:

removing portions of said refractory metal and said conductive oxide layer to form a plurality of gate electrodes, gate contact pads, pixel pads and source contact pads with each of said gate electrodes coupled to one of said gate contact pads.

20. The method as claimed in claim 18 including:

depositing a passivating layer over said matrix transistor elements; and removing said refractory metal from said conductive layer adjacent said matrix transistor elements to form pixel contact pads.

21. The method as claimed in claim 15 wherein:

depositing said semiconductor material includes plasma depositing an amorphous silicon alloy.

22. The method as claimed in claim 15 including:

depositing said intermetal dielectric to cover said gate electrode;

removing a central portion of said dielectric to expose a substantially planar portion of said gate electrode prior to depositing said insulator and said semiconductor material thereon; and depositing a source electrode concurrently with said drain electrode.

23. The method as claimed in claim 22 wherein:

providing said substrate includes providing a glass substrate; and depositing a conductive oxide layer on said insulator layer.

24. The method as claimed in claim 23 wherein:

depositing said gate electrode includes depositing a refractory metal layer on said conductive oxide layer; and removing portions of said refractory metal and said conductive oxide layer to form said gate electrode.

25. The method as claimed in claim 24 including:

depositing a passivating layer over said matrix transistor elements; and removing said refractory metal from said conductive oxide layer adjacent said matrix transistor elements to form pixel contact pads.

26. The method as claimed in claim 25 wherein:

depositing said semiconductor material includes plasma depositing amorphous silicon alloy.

* * * * *

UNITED STATES PATENT AND TRADEMARK OFFICE
CERTIFICATE OF CORRECTION

PATENT NO. : 5,123,847

DATED : June 23, 1992

INVENTOR(S) : Scott H. Holmberg and Richard A. Flasck

It is certified that error appears in the above-identified patent and that said Letters Patent is hereby corrected as shown below:

Column 10, line 20, "matrix" should be deleted.

Signed and Sealed this

Fifth Day of October, 1993

*Attest:*

BRUCE LEHMAN

*Attesting Officer*     *Commissioner of Patents and Trademarks*